CAPACITIVE COUPLING TYPE HIGH FREQUENCY SWITCH

Filed Oct. 9, 1968 2 Sheets-Sheet 1

INVENTOR
YOSHIHIRO KONISHI

Stevens, Davis, Miller & Mosher

BY

ATTORNEYS

CAPACITIVE COUPLING TYPE HIGH FREQUENCY SWITCH

Filed Oct. 9, 1968 2 Sheets-Sheet 2

INVENTOR
YOSHIHIRO KONISHI

BY

ATTORNEYS

United States Patent Office 3,530,504
Patented Sept. 22, 1970

3,530,504

CAPACITIVE COUPLING TYPE HIGH FREQUENCY SWITCH

Yoshihiro Konishi, Sagamihara, Japan, assignor to Japan Broadcasting Corporation, Tokyo, Japan
Filed Oct. 9, 1968, Ser. No. 766,272
Claims priority, application Japan, Oct. 20, 1967, 42/67,180
Int. Cl. H03h *7/02;* H01p *5/12, 1/10*
U.S. Cl. 333—1 9 Claims

ABSTRACT OF THE DISCLOSURE

A capacitive coupling type high frequency switch applicable as a high power switch in VHF or UHF having excellent cutoff characteristics, in which the switch comprises a ring shaped wave guide of a shape having the cutoff region including the frequency of the wave to be switched, and a plurality of coaxial type signal terminals arranged in rotational symmetry. The terminals to be connected are capacitively coupled via a conductor arranged to move at the inside of the wave guide. In this switching condition, the transmission paths of the electromagnetic waves between the terminals which should not be connected, are made as a cutoff region for the frequencies of the waves to be switched.

BACKGROUND OF THE INVENTION

A high frequency and high power switch is used in VHF or UHF transmitters, particularly in such a use as switching between an antenna and a dummy load or between a working transmitter and a stand-by transmitter. Conventional switches of this kind have a construction in which mechanical contact is made between two conductor terminals, and the contact is broken by mechanically separating them.

The conventional switch of this kind of construction has a significant drawback in that contact resistance gives rise to excessive heat dissipation which might cause trouble and that limits the allowable power controlled. Therefore said conventional switches are not applicable in a use of VHF or UHF high power switches.

In order to solve above problems a capacitive coupling type switch, which does not utilize metallic contact between the sliding surfaces of the metal switching terminals, may be considered. In such a capacitive coupling type switch, there is no trouble due to the contact heat caused by the contact resistance as in the mechanical switch. Also this type of switch has the merit of small switching force. Accordingly this type of switch may be suitable for use in high power purposes.

However, such a capacitive coupling type switch has a problem of wave leakage between the terminals which are not desired to be coupled. It is very important to solve this problem in order to realize a practical capacitive coupling type high power switch. For a long time there has been a desire in the VHF and UHF field for the achievement of this kind of capacitive coupling type switch especially for high power applications. Nevertheless, practical switches having these capabilities have not been disclosed so far.

SUMMARY OF THE INVENTION

The present invention relates to a VHF or UHF capacitive coupling type switch especially amenable to high power apparatus having no mechanical contact terminals. More particularly the present invention relates to a capacitive coupling type switch which comprises a ring shaped wave guide so constructed that energy to be blocked by the "open" paths lies in a region of the frequency spectrum for which wave guide is in a cutoff mode of transmission, and such that leakage of the signal which must not be coupled is prevented by virtue of the exponential damping characteristic of the wave guide for the applied frequencies.

In accordance with the present invention a plurality of coaxial type signal terminals are arranged on the ring shaped wave guide having the aforesaid construction in rotational symmetry and each end of the inner conductor of the terminals is exposed in the wave guide. Also in the wave guide one or more coupling conductors are provided having a sufficient length to provide good coupling between the terminals to be coupled. These coupling conductors are arranged to extend along the transmission path of the wave guide, and are mounted to rotate freely.

The connection between the terminals is switched on and off by moving the coupling conductors. Each inner conductor of the signal terminals placed at both ends of the coupling conductor makes a capacitive coupling with each end of the coupling conductor and thus an electric closed loop is completed between the terminals via the coupling conductor. Between the terminals coupled as above and the other noncoupled terminals there exists a sufficient cutoff in practice for blocking the signal leakage since the ring shaped wave guide is constructed to have the cutoff region as explained above.

Said coupling conductors are fixed to a supporting member by means of electric insulators having small high frequency loss such as polytetrafluoroethylene resin known as Teflon by the trade name. The supporting member is in turn fixed to a switching shaft having its rotating axis at the center of a circle forming the circular ring of the ring shaped wave guide. In practice the inner side wall of the ring shaped wave guide may be constructed to rotate freely to act as the supporting member. It is also possible to provide slits in the inner side wall of the ring shaped wave guide and to make the construction of the supporting member to extend inside of the wave guide through the slits.

The present invention has for its primary object to realize a high power switch practically applicable in VHF or UHF bands by utilizing capacitive coupling so to suppress heat dissipation and also to obtain an excellent heat exhalation.

Another object of the present invention is to obtain a high power switch having a construction of low electric power loss and which is effective to prevent a leakage of power between signal terminals which are not coupled.

Another object of the present invention is to obtain a switch easily controllable for the switching operation with a small switching force and therefore able to attain a very short switching time.

A further object of the present invention is to obtain a switch having an excellent transmission efficiency and which is free from troubles such as loose contact or the like.

A still further object of the invention is to provide a novel and simple switch construction having the aforementioned features.

For a better understanding of the invention, reference is made to the accompanying drawings.

BRIEF DESCRIPTION OF THE DRAWING

Like parts are designated by like numerals and symbols throughout the drawings.

DESCRIPTION OF PREFERRED EMBODIMENT

Figures 1A, 1B, 2A, 2B, 3A, 3B, 3C, 4A, 4B, 4C:
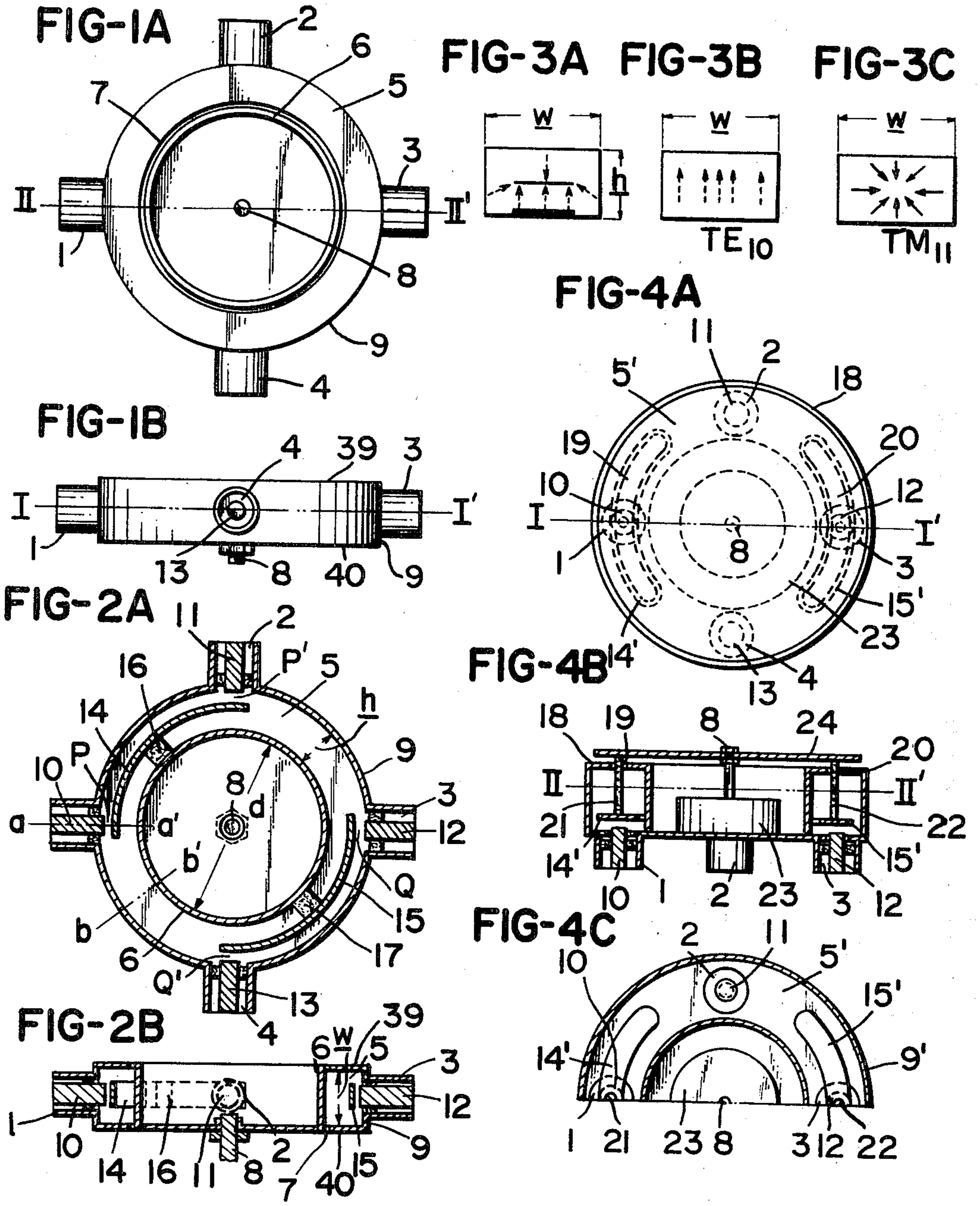
FIGS. 1A and 1B are a plan view and a side view, respectively, showing a fundamental embodiment of the capacitive coupling type high frequency switch according to the present invention.
FIGS. 2A and 2B are sectional views, taken along the line I–I' of FIG. 1B and the line II–II' of FIG. 1A, respectively, showing the construction thereof.
FIG. 3A is a diagrammatic illustration of a section taken along the line $a$–$a'$ of FIG. 2A, showing the high frequency electromagnetic field therein.
FIG. 3B and 3C are diagrammatic illustrations similar to FIG. 3A, showing electric field distribution mode and magnetic field distribution mode, respectively, at the section along the line $b$–$b'$ of FIG. 2A.
FIG. 4A is a plan view of another embodiment of the high frequency switch according to the present invention, showing the construction thereof in dotted lines.
FIG. 4B is a sectional view, taken along the line I–I' of FIG. 4A.
FIG. 4C is a sectional view, taken along the line II–II' of FIG. 4B.

FIGS. 1A and 1B illustrate an embodiment of the capacitive coupling type high frequency switch according to the present invention. In this embodiment four coaxial signal terminals 1, 2, 3, and 4, are mounted on the outer peripheral side wall 9 of a ring shaped wave guide 5 in the radial direction and at positions in rotational symmetry. The ring shaped wave guide 5 has a cross section of parallelogram shape, and the inner side wall 6 opposing said outer side wall 9 is so constructed as to rotate about the shaft 8 with clearance 7 from top and bottom plates of the wave guide. The structure of the wave guide is such that it forms a cutoff region for the frequencies to be switched.

In FIGS. 2A and 2B, showing sectional views of the high frequency switch of FIGS. 1A and 1B, the end surface of each of inner conductors 10, 11, 12, and 13 of the four coaxial signal terminals 1, 2, 3, and 4 terminates substantially flush with the inner surface of the outer side wall 9. In this particular embodiment of the present invention, a pair of coupling conductors 14 and 15 are disposed at inside of the ring shaped wave guide 5 forming transmission paths for the wave in a concentric manner with respect to the rotary shaft 8. Each of coupling conductors 14 and 15 has a length sufficient to establish a capacitive coupling between adjacent coaxial terminals, for instance between the terminals 1 and 2, and between the terminals 3 and 4, respectively. The coupling conductors 14 and 15 are secured to the inner side wall 6 of the ring shaped wave guide 5 through electric insulating members 16 and 17, respectively. The insulating members 16 and 17 are made by material having a low dielectric loss in high frequencies, and they are, for instance, made of Teflon (trade name) and according to the need of oxide beryllium having even a larger heat conductivity than that of Teflon. The coupling conductors 14 and 15 should be disposed accurately on arcuate lines of a circle so as to make the intervals between the end portions of the coupling conductors 14 and 15 and the respective end surface of inner conductors 10, 11 or 12, 13 as nearly identical as possible. Furthermore, the coupling conductors 14 and 15 are made to rotate freely about the shaft 8 by 90 degrees while retaining an accurate relative position with each other.

In order to make the ring shaped wave guide 5 to provide a cutoff region for the frequencies to be switched, each transmission path between adjacent coaxial signal terminals is basically formed as to mainly produce $TE_{10}$ mode and $TM_{11}$ mode of transmission, whose cutoff region can be controlled for the $TE_{10}$ mode and $TM_{11}$ mode by adjusting the distance $w$ between the top plate 39 and the bottom plate 40. By decreasing the distance $w$ the attenuation between adjacent coaxial signal terminals for the switching waves increases exponentially, and the power leakage can be reduced to a practically allowable amount.

On the other hand, as shown in FIG. 2A, there are formed static capacitances P, P', Q, and Q' between the end portions of the coupling conductors 14, 15 and the respective inner conductors, and electric wave is transmitted, for instance, from the coaxial terminal 1 to the terminal 2, and from the coaxial terminal 3 to the coaxial terminal 4, respectively. In this case, the electric waves passing through the coupling conductors 14 and 15 are transmitted in a strip line transmission mode.

The connection between each of the adjacent coaxial terminals can be switched over by turning the rotary shaft 8 by 90 degrees. Then, both coupling conductors 14 and 15 swing simultaneously, so as to establish a connection between the coaxial terminals 2 and 3, and between the coaxial terminals 1 and 4, respectively and the switching operation is completed.

The reason for attenuation of the $TE_{10}$ mode and $TM_{11}$ mode of the transmission of the switch according to the present invention will now be described. FIG. 3A shows an electromagnetic field distribution in the $a$–$a'$ section of FIG. 2A. The field of FIG. 3A is considered to be a resultant field of the $TE_{10}$ mode, as shown in FIG. 3B and the $TM_{11}$ mode, as shown in FIG. 3C. The electric field at the section $b$–$b'$ of FIG. 2A is of $TE_{10}$ mode, as depicted in FIG. 3B. Thus, the $TE_{10}$ wave can be attenuated by reducing the distance $w$ between the top plate 39 and the bottom plate 40, while the $TM_{11}$ wave can be attenuated by reducing the distance $w$ and $h$, as shown in FIGS. 2A and 2B. Therefore as shown in FIGS. 3A to 3C, by reducing the distance $h$ and $w$, both the $TE_{10}$ mode and the $TM_{11}$ mode are shifted into the cutoff region for the frequencies to be switched, and accordingly, such modes of transmission attenuate exponentially along the distance of the wave guide.

As a numerical example, it may be mentioned that by using a ring shaped wave guide 5 of $h \doteqdot 5$ cm., $w \doteqdot 5$ cm., and the inside diameter $d$ of the inner side wall 6 of about 30 cm., both the $TE_{10}$ mode and the $TM_{11}$ mode of UHF oscillation can be attenuated to prevent the leakage of the noncoupled terminals and the attenuation level of about 70 db can be obtained.

FIGS. 4A to 4C illustrate a second embodiment of the present invention usable also for UHF applications, like the preceding embodiment. FIG. 4A shows a plan view of the second embodiment, and FIG. 4B shows a sectional view taken along the line I–I' of FIG. 4A, and another section taken along the line II–II' of FIG. 4B is shown in FIG. 4C. Those parts in the second embodiment which perform similar functions to the corresponding parts of the first embodiment are shown by the same reference numerals.

The major difference of this second embodiment from the first embodiment is in that both of the side walls of the ring shaped wave guide 5' are fixed. A pair of coupling conductors 14' and 15' are supported by holders 21 and 22 made of electric-insulating but heat-conducting material, such as oxide beryllium porcelain extending to the wave guide through the slits 19 and 20 bored on the top plate 18 of the wave guide 5'. The holders 21 and 22 are in turn connected to a heat dissipating disk 24 driven by a reversible driving motor 23. The aforesaid slits 19 and 20 are such that they extend substantially along the center line of the annular top plate 18 of the ring shaped wave guide 5' in an arcuate form with the center of curvature at the axis of the shaft 8, and each slit 19 or 20 is long enough to allow the rotation of the corresponding holder 21 or 22 by at least 90 degrees along the slit.

In this case, the slits 19 and 20 are formed at about the center of the ring shaped wave guide 5' in an arcuate form, therefore such slits do not disturb the transmission mode $TE_{10}$, which is the major mode in the wave guide. Accordingly, there is practically no higher mode waves generated in the wave guide, and the existence of the aforesaid slits does not cause any increase in the leakage.

Of course, the electric performance characteristics of the ring shaped wave guide in this embodiment is to form a cutoff region for the frequencies to be switched, as in the case of the preceding embodiment.

The switching operation of the second embodiment of the aforesaid construction is identical with that of the preceding embodiment, described in detail hereinbefore referring to FIGS. 1A to 3C. Therefore, details of the operation need not be repeated. The feature of the second embodiment is in that it provides a still better heat dissipation because the coupling conductors 14' and 15' are held by the heat dissipating disk 24 through holders 21 and 22 made of oxide beryllium porcelain. Thus, the second embodiment is particularly useful for high power UHF applications.

Figure 5A:
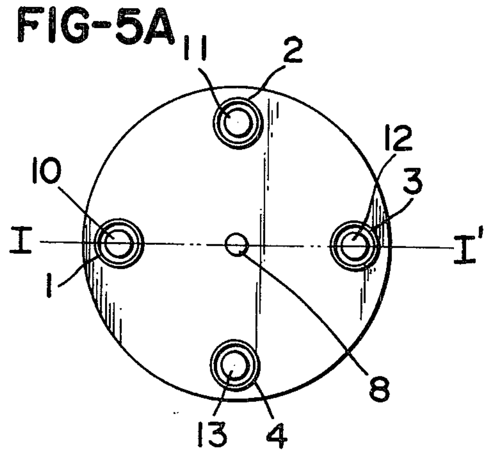
FIG. 5A is a plan view of another embodiment of the present invention, especially suitable for VHF circuit switching application.
Figure 5B:
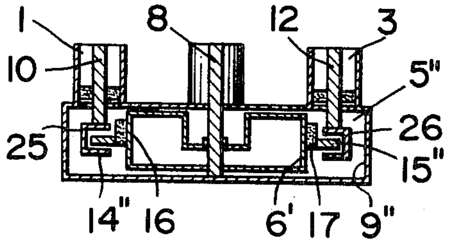
FIG. 5B is a sectional view taken along the line I–I' of FIG. 5A.

FIGS. 5A and 5B illustrate a third embodiment of the present invention, particularly suitable for VHF applications.

FIG. 5A shows a plan view of the third embodiment, and FIG. 5B shows a sectional view taken along the line I–I' of FIG. 5A.

In this third embodiment, an inner side wall 6' forming a part of the transmission path of the ring shaped wave guide 5'' is affixed to the rotary shaft 8 and adapted to rotate in response to the rotation of the shaft 8, while maintaining an exactly constant spacing from the outer side wall 9''.

Conductor members 25 and 26, which are so shaped as to surround a coupling conductor 14'', or 15'', are secured to the lower end of each inner conductor of coaxial terminals 1, 2, 3, or 4, so that a large surface area facing the coupling conductor 14'' or 15'' can be provided for each coaxial terminal. If it is desired to further strengthen the capacitive coupling between adjacent coaxial terminals through the coupling conductors, the surfaces of the aforesaid conductor members 25 and 26 which face the coupling conductors can be coated with a suitable substance of dielectric material, such as Teflon known by the trade name.

The coupling conductors 14'' and 15'' are secured to holders 16 and 17 made of electric-insulating material, which holders are in turn fixed to the movable inner side wall 6' of the ring shaped wave guide 5''. In this particular embodiment, as shown in FIGS. 5A and 5B, when the coupling conductors 14'' and 15'' are at one operative position, capacitive coupling is established in one direction between adjacent coaxial terminals, e.g., between coaxial terminals 1 and 2 as well as between coaxial terminals 3 and 4, while when the coupling conductors 14'' and 15'' are rotated by 90 degrees about the shaft 8 to another operative position, the capacitive coupling is switched over to other terminals, e.g., between coaxial terminals 2 and 3 between coaxial terminals 4 and 1. As described above referring to the preceding embodiments, the ring shaped wave guide 5'' is so constructed as to provide a cutoff region for frequencies to be switched. Accordingly, energy leakage through the non-coupled portions of the wave guide, i.e., the portions where the coupling conductor 14'' or 15'' is not situated, can be suppressed in an allowable level.

In the third embodiment illustrated in FIGS. 5A and 5B, there are gaps between the inner side wall 6' and the top plate and between the inner side walls 6' and the bottom plate, but the impedance of such gaps can be lowered sufficiently to an amount practically suitable for VHF band frequencies to be switched.

Figure 6:
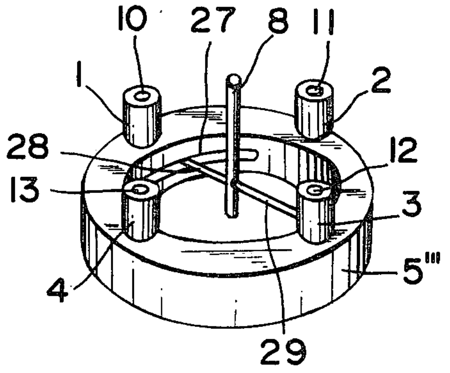
FIG. 6 is a perspective view of a modified embodiment of the switch according to the present invention.

As another embodiment, a ring shaped wave guide 5''' enclosed by fixed walls can be used for VHF band applications, as shown schematically in FIG. 6. In this case, a pair of slits 27 are formed on the inner side wall 26 substantially along the center line thereof, which slits 27 are long enough to allow rotation of holders 28 and 29 about the shaft 8 by 90 degrees. Coupling conductors are held inside the ring shaped wave guide 5''' by the holders 28 and 29, respectively. The holders 28 and 29 are secured to the shaft 8. By rotating the shaft 8 by 90 degrees in either direction, the switching operation of this switch can be carried out.

As can be seen from the embodiments described hereinbefore, the high frequency switch according to the present invention uses the cutoff region in the electromagnetic wave transmission mode of the wave guide, in which energy attenuation in the wave guide between adjacent coaxial terminals increases exponentially. Therefore, in those wave guide portions where there is no coupling conductor, the leakage of electromagnetic wave energy can be suppressed to an allowable amount for all practical purposes. The coaxial terminals to be connected together are coupled with each other through static capacitances existing between such coaxial terminals and the coupling conductor. In the coupling conductor itself, the electromagnetic wave is transmitted in a strip line mode. Accordingly, the electromagnetic wave passes through the switch without being affected by the wave propagation characteristics of such conductive portion of the wave guide constituting the switch according to the present invention.

Thus, the high frequency switch of the present invention uses capacitive coupling for providing a transmission path between adjacent terminals, and is not provided with any mechanical contacts. Consequently, in addition to the aforesaid advantages, the high frequency switch according to the present invention is free from heat generation which might be expected in conventional switches due to incomplete metallic contact or high contact resistances, or other reasons. Furthermore, additional heat dissipating members can easily be incorporated in the high frequency switch of the present invention, such as the heat dissipating disk 24 holding the coupling conductors 14' and 15', as shown in FIGS. 4A to 4C. Thus, the present invention provides excellent high power VHF or UHF switches.

The present invention is not limited to the aforesaid embodiment, but numerous modifications are possible within the scope of the invention. For instance, the number of coaxial terminals to be provided in the switch is not limited to four, but it can be increased to six, such as terminals 30 to 35 shown in the embodiment of FIG. 7, or it can be further increased to eight or more. With such increase of the numbers of coaxial terminals, the number of coupling conductors may also be increased to a desired number for instance three, such as coupling conductors 36, 37 and 38 shown in FIG. 7, or it can be increased to four or more. At the same time, the angle of the shaft rotation for each switching operation should be modified to 60 degrees, 45 degrees, and so on.

Figure 7:
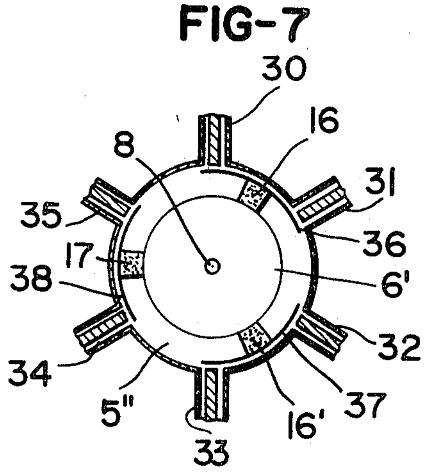
FIG. 7 is a diagrammatic illustration of still further embodiment of the invention having six coaxial terminals.

The coaxial terminals can be mounted on the high frequency switch of the present invention in any suitable manner, depending on the conditions of each application, such as on the outer peripheral surface of the ring shaped wave guide in radial direction, as shown in FIGS. 1A and 7, or on the top or bottom plate thereof at right angles to such plate, as shown in FIGS. 4A to 6. In the case of mounting the terminals on the top or bottom plate, the dimension of the ring shaped wave guide should somewhat be decreased, as compared with that in the case of mounting the terminals on the peripheral surface of the wave guide, by a reason to insure the effective leakage suppression by providing sufficient attenuation of $TE_{10}$ wave and $TM_{11}$ wave in the wave guide.

As described in the foregoing, referring to different embodiments, this invention provides a high frequency switch having the cutoff region of the ring shaped wave guide for preventing energy leakage between noncoupled terminals while establishing capacitive coupling between terminals to be connected. Thus, the energy leakage between noncoupled terminals is effectively suppressed to a harmless level, and the switching operation can be carried out very quickly. Furthermore, the high frequency switch of the present invention does not have any contact resistance, such as those of known switches, and accordingly, there is not heat generation caused by such contact resistances. Therefore, the present invention provides excellent switches for VHF and UHF applications.

What is claimed is:

1. A capacitive coupling type high frequency switch comprising a ring shaped waveguide having an electromagnetic wave transmission path providing a cutoff region for frequencies to be switched; a plurality of terminals disposed on said electromagnetic wave transmission path substantially at uniform intervals, while exposing the end surfaces of inner conductors of the terminals within said electromagnetic wave transmission path; at least one coupling conductor movably disposed in said electromagnetic wave transmission path and having a length that end surfaces of the coupling conductor are situated at the terminals to effectively establish a capacitive coupling therebetween; said ring shaped wave guide having a rotatable inner sidewall and said coupling conductor being secured to said rotatable inner side wall through electric insulating members; and a means to move said coupling conductor relative to said terminals to perform switching operations.

2. A capacitive coupling type switch according to claim 1, wherein said terminals are formed as coaxial terminals and are radially disposed on the outer peripheral surface of said ring shaped wave guide.

3. A capacitive coupling type switch according to claim 1, wherein said ring shaped wave guide has a number of slits circumferentially formed on the inner side wall thereof, said number of slits depending on the number of terminals, and said means to move said coupling conductor consists of a rotary shaft disposed at the geometrical center of said ring shaped wave guide and at least one arm secured to said rotary shaft at one end thereof and extending through said slit so as to carry said coupling conductor at the opposite end thereof.

4. A capacitive coupling type switch according to claim 3 wherein said terminals are mounted on a planar wall of said ring shaped wave guide extending between inner and outer side walls thereof, with the axes of said terminals disposed at right angles to said planar wall of the ring shaped wave guide.

5. A capacitive coupling type switch according to claim 1, wherein said ring shaped waveguide has a number of slits circumferentially formed on a planar wall thereof between inner and outer sidewalls, said number of slits depending on the number of said coaxial terminals, and said means to move said coupling conductor consists of a rotary shaft disposed at the geometrical center of said ring shaped wave guide, a heat dissipating disk secured to said rotary shaft, and at least one electric-insulating heat-conducting member secured to said heat dissipating disk at one end thereof and extending through said slit so as to carry said coupling conductor at the opposite end thereof.

6. A capacitive coupling type switch according to claim 5 wherein said terminals are mounted on a planar wall of said ring shaped wave guide extending between inner and outer sidewalls thereof, with the axes of said terminals disposed at right angles to said planar wall of the ring shaped wave guide.

7. A capacitive coupling type switch according to claim 1 wherein said terminals are mounted on a planar wall of said ring shaped wave guide extending between inner and outer side walls thereof, with the axes of said terminals disposed at right angles to said planar wall of the ring shaped wave guide.

8. A capacitive coupling type high frequency switch comprising, a ring shaped wave guide having an electromagnetic wave transmission path providing a cutoff region for frequencies to be switched; four coaxial terminals disposed on a wall of said ring shaped wave guide substantially at uniform intervals along said electromagnetic wave transmission path, while exposing the end surface of inner conductors of said coaxial terminals within said electromagnetic wave transmission path; two coupling conductors movably disposed in said electromagnetic wave transmission path and having such length that both ends of each said coupling conductor face said end surfaces of the inner conductors of adjacent terminals so as to establish effective coupling therebetween; and an actuating means consisting of a rotary shaft disposed at the geometrical axis of said ring shaped wave guide and link arms connecting said coupling conductors to said rotary shaft, said coupling conductors being angularly reciprocative in said transmission path by 90 degrees in response to the corresponding rotation of said rotary shaft.

9. A capacitive coupling type switch according to claim 8, wherein said ring shaped wave guide has two slits circumferentially formed on a planar wall thereof between inner and outer side walls, and said actuating means includes a heat dissipating disk secured to said rotary shaft, and two electric-insulating heat-conducting members secured to said heat dissipating disk at one end thereof and extending through said two slits, respectively, so as to carry said coupling conductors at the opposite ends thereof.

References Cited

UNITED STATES PATENTS

| | | | |
|---|---|---|---|
| 2,788,494 | 4/1957 | Vogeley et al. | 333—7 |
| 2,826,742 | 3/1958 | Hollis et al. | 333—7 |
| 3,193,828 | 7/1965 | Morrison | 333—7 X |

PAUL L. GENSLER, Primary Examiner

U.S. Cl. X.R.

333—7, 24